United States Patent [19]

Taylor

[11] 4,051,395

[45] Sept. 27, 1977

[54] WEIGHT ACTUATED PIEZOELECTRIC POLYMERIC TRANSDUCER

[75] Inventor: Allen L. Taylor, Woodbury, Minn.

[73] Assignee: Minnesota Mining and Manufacturing, St. Paul, Minn.

[21] Appl. No.: 603,155

[22] Filed: Aug. 8, 1975

[51] Int. Cl.² .......................................... H01L 41/04
[52] U.S. Cl. ...................................... 310/329; 310/330
[58] Field of Search .................. 310/8.3, 8.4, 8.5, 8.6, 310/9.5, 9.1

[56] References Cited

U.S. PATENT DOCUMENTS

| | | | |
|---|---|---|---|
| 2,808,524 | 10/1957 | Feinstein | 310/8.4 |
| 3,030,606 | 4/1962 | Harris | 310/8.4 X |
| 3,241,373 | 3/1966 | Ricketts et al. | 310/8.4 UX |
| 3,374,663 | 3/1968 | Morris | 310/8.4 X |
| 3,832,580 | 8/1974 | Yamamuro et al. | 310/8.5 X |

OTHER PUBLICATIONS

Electroacoustic Transducers w/Piezoelectric High Polymer Films, by Tamura et al., JAES, vol. 23, No. 1, Jan./Feb., 1975.

Primary Examiner—Mark O. Budd
Attorney, Agent, or Firm—Cruzan Alexander; Donald M. Sell; Walter N. Kirn

[57] ABSTRACT

A piezoelectric polymer transducer for converting mechanical energy into electrical energy includes a transducing means formed of a polymeric piezoelectric layer of material that is connected at its ends to a support means in such fashion that it can readily vibrate. The piezoelectric layer is coated on at least an outer portion of each of its planar surfaces with conductive electrodes and a weight is attached to the piezoelectric layer to act as an inertial mass to accentuate bending of such layer in response to movement of the support means.

1 Claim, 5 Drawing Figures

U.S. Patent      Sept. 27, 1977      4,051,395
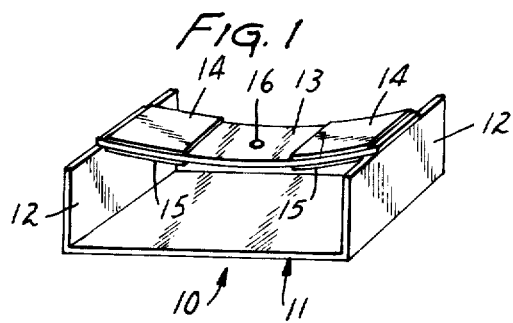
FIG. 1
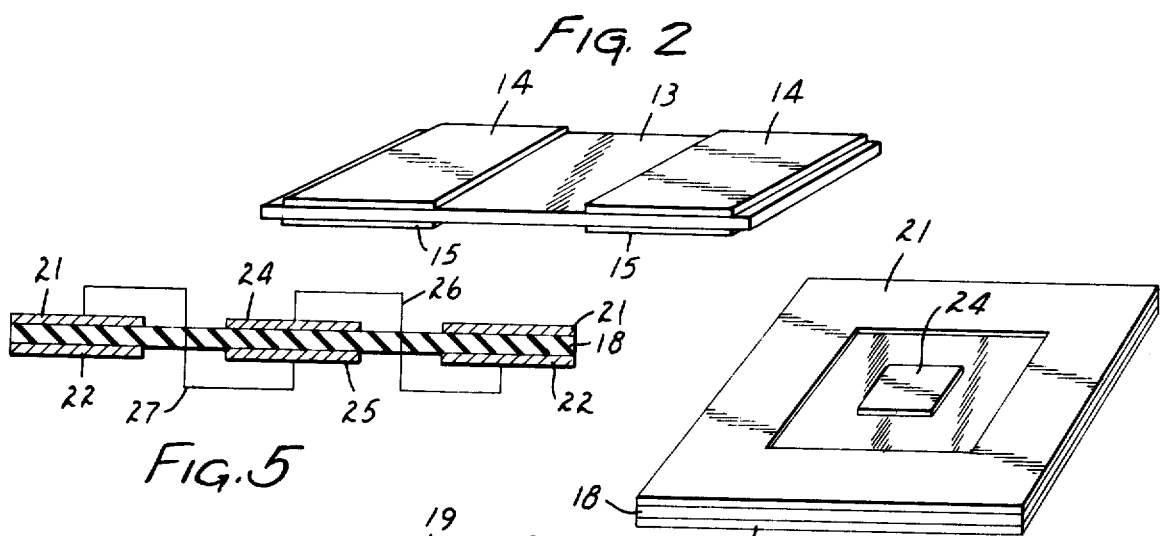
FIG. 2
FIG. 5
FIG. 4
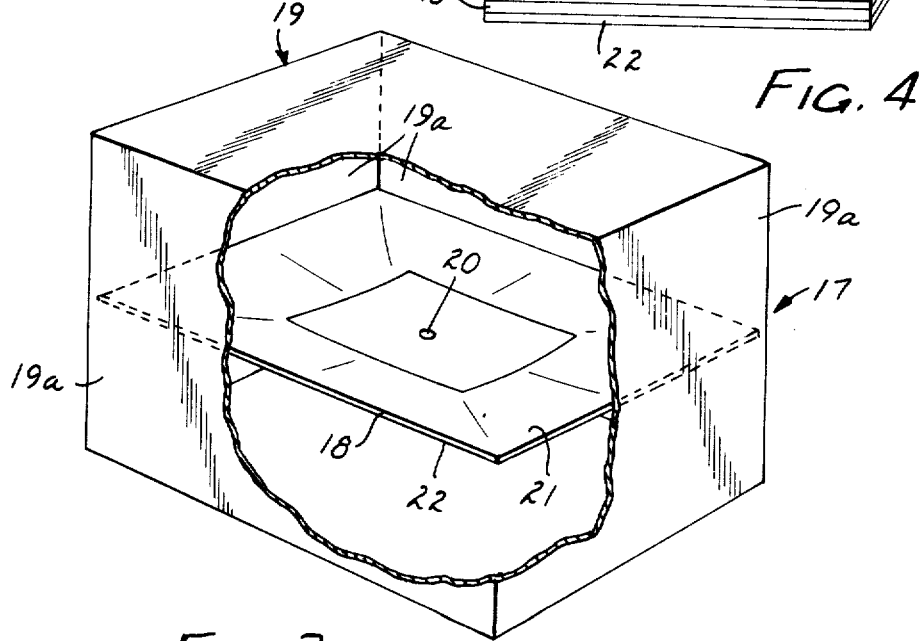
FIG. 3

WEIGHT ACTUATED PIEZOELECTRIC POLYMERIC TRANSDUCER

BACKGROUND OF THE INVENTION

1. Field of the Invention

The present invention relates in general to piezoelectric transducers for converting mechanical energy into electrical energy, and more specifically relates to transducers that are formed from a compliant polymeric piezoelectric material.

2. Description of the Prior Art

Devices are known in the art that employ piezoelectric crystals mounted in cantilever fashion and end loaded such that they are caused to oscillate during movement of the devices as shown in U.S. Pat. to Ko, No. 3,456,134. The Ko patent employs an oscillating piezoelectric crystal that converts mechanical energy into electrical energy to power human implants such as heart pacemakers. Used solely as an energy transducer the Ko device may operate relatively satisfactorily, but for other uses such as a motion detector it has several deficiencies. Firstly, because the Ko device employs a crystal as its piezoelectric sensing medium, its sensitivity is limited by the rigidity of the crystal; secondly, the Ko device is not adapted to provide a uniform output upon movement of the device in various directions and in fact will provide substantially no output in certain directions.

The energy transducer of the present invention employs a resilient polymeric piezoelectric material that not only provides high sensitivity, but also is relatively inexpensively and readily manufactured.

SUMMARY OF THE INVENTION

The present invention provides a piezoelectric polymeric transducer for converting mechanical energy into electrical energy and is formed of a support means, a layer of compliant polymeric piezoelectric material connected to the support means, conductive electrodes carried on at least an outer portion of each planar surface of the piezoelectric layer, and a weight attached to such layer.

In a preferred embodiment the piezoelectric layer is fastened at two opposite ends to the support means and the weight attached to such layer is mounted substantially midway between the fastened ends of the layer to act as an inertial mass for producing bending of said piezoelectric layer in response to movement of the housing. Due to movement of the layer, and its piezoelectric characteristics, electrostatic charges of opposite polarities are produced on the outer surfaces of such layer and are collected by the conductive electrodes carried thereon.

In a modified embodiment the piezoelectric layer is fastened at each side to the walls of a housing in drum head fashion to provide a transducer that is highly durable in order that it may be used in applications wherein it may be subjected to severe motion.

BRIEF DESCRIPTION OF THE DRAWINGS

FIG. 1 is a perspective view of a preferred embodiment of the piezoelectric polymeric transducer of the present invention that includes a piezoelectric layer and conductive electrodes that are shown enlarged;

FIG. 2 is an enlarged side view of the piezoelectric layer that is employed in the transducer of FIG. 1 and is coated with conductive electrodes on its outer surfaces;

FIG. 3 is a perspective view of a first modified embodiment of the energy transducer of the present invention and with portions cut away to show an interior piezoelectric layer with conductive electrodes;

FIG. 4 is an enlarged perspective view of a modified embodiment of the piezoelectric layer and conductive electrodes of FIG. 3; and FIG. 5 is a diagrammatic cross sectional view of the piezoelectric layer and conductive electrodes of FIG. 4 with interconnecting leads shown.

DESCRIPTION OF THE PREFERRED EMBODIMENTS

Referring now to the drawings and with reference first to FIG. 1, a preferred embodiment of the present invention is shown in the form of a transducer 10 for converting mechanical energy into electrical energy. The transducer 10 includes a support means that may be of various shapes but is shown as a substantially U-shaped frame 11 having a pair of vertical legs 12 between which a layer of piezoelectric material 13 such as poled polyvinylidene fluoride is connected. The layer 13 is not stretched tightly between the support frame legs 12 and instead is permitted to sag in order that it will vibrate substantially uniformly in response to motion that changes the center of mass of the transducer 10. A weight 16 is mounted on the piezoelectric layer 13 and is sufficiently heavy to act as an inertial mass to accentuate vibration of the layer 13.

Vibration of the piezoelectric layer 13 results in the development of electrostatic charges of opposite polarity on the planar surfaces thereof because of the piezoelectric characteristics of the layer 13. Thus, the transducer 10 serves to transform mechanical energy into electrical energy. To accumulate the charges developed on the layer 13, conductive electrodes 14 and 15 may be formed from material such as nickel, copper or the like and are partially coated on the ends of the planar surfaces of the layer 13. The electrodes 14 and 15 do not cover the middle portion of the planar surfaces of the layer 13 because it has been found that vibration of the piezoelectric layer 13 causes the outer portion of the layer to bend in an opposite direction to that of its middle portion. Thus, such bending would produce a canceling effect of electrostatic charges if the electrodes 14 and 15 completely covered the planar surfaces of the layer 13.

The transducer 10 may be used in a wide variety of energy supply applications such as for providing electrical power for a kinetic sensor as evidenced by my copending application Ser. No. 603,193, filed on even date herewith and incorporated herein by reference.

It is not essential that the piezoelectric layer be connected at two ends as shown in FIG. 1 and instead, may be attached in drum head fashion at all four edges. Referring now to FIG. 3, a transducer 17 is shown having a piezoelectric layer 18 disposed in a housing 19 with each edge of the layer 18 connected to housing sidewalls 19a. A weight 20 is attached to the middle of the layer 18 to promote vibration of same. Coated on the planar surfaces of the layer 18 are conductive electrodes 21 and 22. To avoid electrostatic charge cancellation as previously described above, the electrodes 21 and 22 do not completely cover the surfaces of the layer 18 as the middle portions thereof are not covered by the electrodes 21 and 22. However, if desired conductive electrodes 24 and 25 may be disposed on the middle portions of the surfaces of the layer 18, as shown in FIGS.

4 and 5. Preferably, the electrodes 24 and 25 are connected to the electrodes 21 and 22 by electrical leads 26 and 27 respectively so that the electrodes 24 and 25 serve to increase the energy provided by the transducer 17.

Thus, the transducer 17 provides a highly durable structure since all edges of the layer 18 are attached to the housing sidewalls 19a and the transducer 17 can be used in situations wherein it may be subjected to severe vibration. Although rectangularly shaped piezoelectric layers have been solely described herein, the shape of the piezoelectric layers is not critical to the present invention as various shaped piezoelectric layers may be employed such as circular, elliptical, oval, etc.

What is claimed is:

1. A piezoelectric polymeric transducer for converting mechanical energy to electrical energy comprising:
   a support means;
   at least one layer of compliant, poled, polymeric, piezoelectric material attached by at least two opposite ends to said support means, said piezoelectric material being such as to produce electrostatic charges of opposite polarity on its opposite major surfaces when subjected to bending;
   first conductive electrodes carried on only the outer portions of at least two opposite ends of each planar surface of said one piezoelectric layer adjacent to said support means;
   second conductive electrodes carried on the center portions of the planar surfaces of said one piezoelectric layer, said first and second conductive electrodes being electrically connected to each other to adjust the electrical energy output of said transducer; and
   a weight connected to said one piezoelectric layer in such fashion that said weight acts as an inertial mass to produce bending of said one piezoelectric layer in response to movement of said support means.

* * * * *